US012656432B2

(12) United States Patent (10) Patent No.: US 12,656,432 B2

Dietz et al. (45) Date of Patent: Jun. 16, 2026

(54) GRADIENT COIL UNIT WITH COOLING DUCT

(71) Applicant: Siemens Healthcare GmbH, Erlangen (DE)

(72) Inventors: Peter Dietz, Fürth (DE); Stefan Stocker, Grossenseebach (DE)

(73) Assignee: Siemens Healthineers AG, Forchheim (DE)

( * ) Notice: Subject to any disclaimer, the term of this patent is extended or adjusted under 35 U.S.C. 154(b) by 248 days.

(21) Appl. No.: 18/521,066

(22) Filed: Nov. 28, 2023

(65) Prior Publication Data

US 2024/0201295 A1 Jun. 20, 2024

(30) Foreign Application Priority Data

Dec. 15, 2022 (EP) .................................... 22213892

(51) Int. Cl.
G01R 33/385 (2006.01)

(52) U.S. Cl.
CPC ..... G01R 33/3856 (2013.01); G01R 33/3852 (2013.01)

(58) Field of Classification Search
CPC ............ G01R 33/3852; G01R 33/3856; G01R 33/3858
See application file for complete search history.

(56) References Cited

U.S. PATENT DOCUMENTS

| | | | |
|---|---|---|---|
| 6,741,152 B1 | 5/2004 | Arz et al. | |
| 10,908,241 B2 | 2/2021 | Dietz | |
| 11,422,215 B2 | 8/2022 | Dietz | |
| 2007/0236218 A1* | 10/2007 | Liu ..................... | G01R 33/3856 324/318 |
| 2007/0247156 A1* | 10/2007 | Schuster ............ | G01R 33/3856 324/318 |
| 2008/0259560 A1* | 10/2008 | Lvovsky ............ | G01R 33/3856 361/689 |
| 2020/0049780 A1 | 2/2020 | Stocker et al. | |

FOREIGN PATENT DOCUMENTS

| | | |
|---|---|---|
| CN | 212275949 U | 1/2021 |
| DE | 19839987 A1 | 3/2000 |
| DE | 102018206643 A1 | 10/2019 |
| EP | 3608929 A1 | 2/2020 |

* cited by examiner

*Primary Examiner* — Judy Nguyen

*Assistant Examiner* — Adam S Clarke

(74) *Attorney, Agent, or Firm* — Banner & Witcoff, Ltd.

(57) ABSTRACT

A gradient coil unit may include a gradient coil surrounding a cylinder axis and configured to generate a magnetic field gradient in a first spatial direction. The gradient coil may include a hollow cylindrical primary layer having two primary conductor structural units and a cooling duct. One primary conductor structural unit respectively of the two primary conductor structural units is formed from one primary electrical conductor respectively, where primary electrical conductor can be divided into two sections connected to one another in series. The cooling duct may be arranged at least partially between the two sections. The two sections and the cooling duct may run at least partially parallel. The two sections may have one contact surface respectively with the cooling duct.

15 Claims, 5 Drawing Sheets

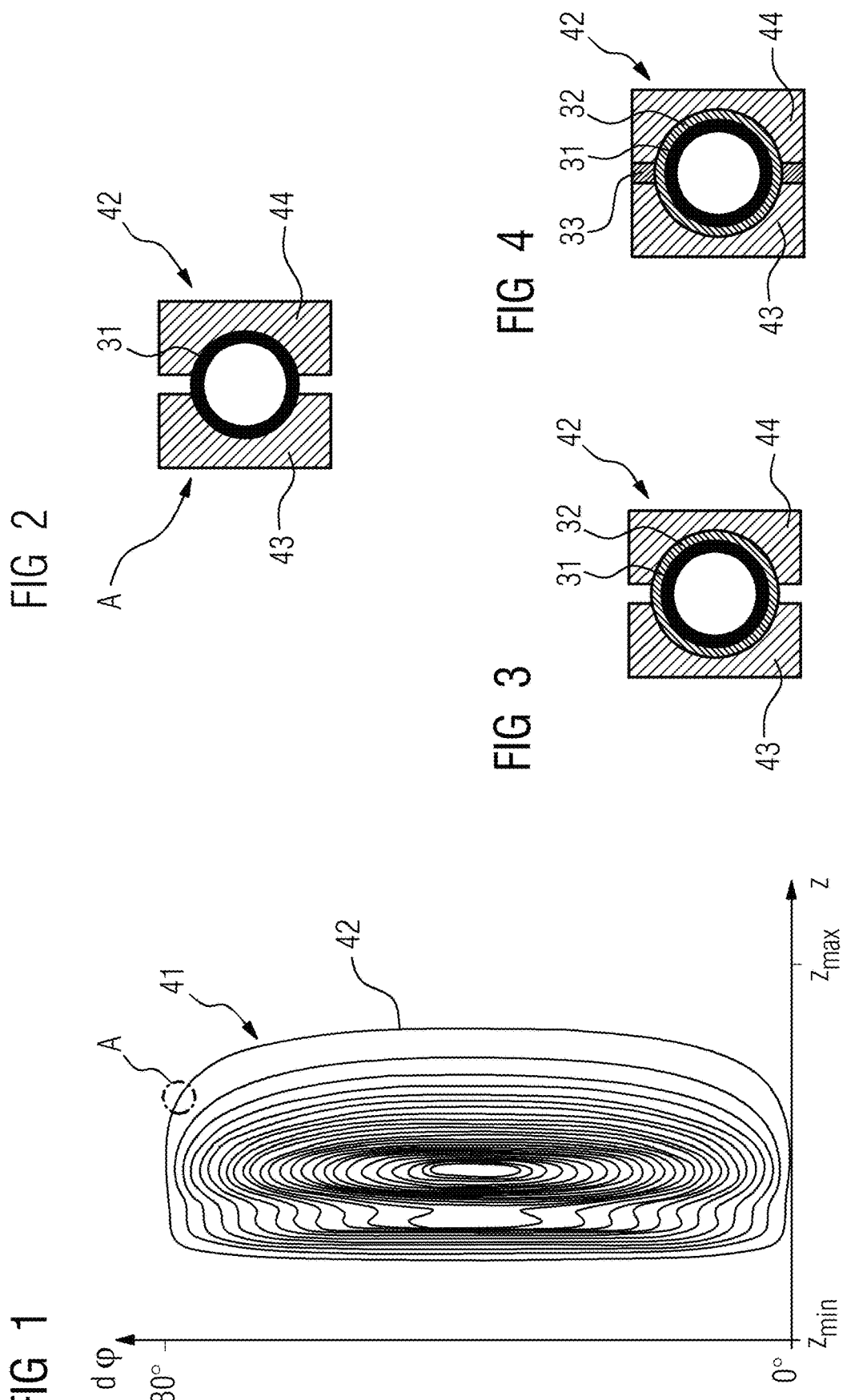

GRADIENT COIL UNIT WITH COOLING DUCT

CROSS REFERENCE TO RELATED APPLICATIONS

This patent application claims priority to European Patent Application No. 22213892.7, filed Dec. 15, 2022, which is incorporated herein by reference in its entirety.

BACKGROUND

Field

The disclosure relates to a gradient coil unit comprising a primary layer with two primary conductor structural units respectively surrounding a cooling duct in series, to a gradient system and to a magnetic resonance device.

Related Art

In a magnetic resonance device, the body of an examination object to be examined, in particular of a patient, is conventionally exposed to a relatively high main magnetic field, for example of 1.5 or 3 tesla, with the aid of a main magnet. Gradient pulses are played out with the aid of a gradient coil unit in the framework of magnetic resonance imaging (MR imaging). In addition, high-frequency radio-frequency pulses (RF pulses), in particular excitation pulses, are then emitted by a radio-frequency antenna unit by means of suitable antenna facilities, and this results in the nuclear spins of particular atoms resonantly excited by way of these RF pulses being tilted about a defined flip angle with respect to the magnetic field lines of the main magnetic field. On relaxation of the nuclear spins, radio-frequency signals, what are known as magnetic resonance signals, are irradiated, which are received by means of suitable radio-frequency antennas and then processed further. Finally, the desired image data can be reconstructed form the raw data acquired in this way.

For a particular measurement, a particular magnetic resonance control sequence (MR control sequence), also called a pulse sequence, is to be emitted therefore, which is composed of a sequence of radio-frequency pulses, for example excitation pulses and refocusing pulses, and gradient pulses to be emitted appropriately coordinated therewith, in various gradient axes along various spatial directions. Readout windows, which predefine the periods in which the induced magnetic resonance signals are captured, are set in a manner that is appropriate time-wise.

A gradient coil unit conventionally comprises three gradient coils. The three gradient coils are embodied to generate magnetic field gradients in three mutually perpendicular spatial directions. A magnetic field gradient is typically a magnetic field of the first order and/or linear order, in particular a magnetic field whose amplitude linearly increases along a spatial direction. A gradient coil conventionally comprises at least one primary coil and a secondary coil, with the two being embodied in the shape of hollow cylinders. Outside of the patient-receiving area the effect of a primary coil is largely suppressed by a secondary coil associated with the primary coil. The secondary coil typically surrounds the corresponding primary coil and is electrically connected to it in series.

A magnetic field gradient is generated by actuating the primary coil with electrical currents whose amplitudes reach several 100 A and are subject to frequent and rapid changing of the current direction with rise and drop rates of several 100 kA/s. A magnetic field gradient is thus a magnetic field which changes over time.

Stronger magnetic field gradients and/or greater rise and drop rates typically enable raw data more to be recorded quickly and/or enable higher resolution image data. In particular in examinations of the head of an examination object, especially with diffusion-weighted recordings and/or when a magnetic resonance device with a main magnetic field of more than 3 tesla is used, particularly strong magnetic field gradients of up to 500 mT/m with rise and drop rates of up to 1000 T/s/m, in special cases up to 2000 T/s/m, are desirable. In this case, power dissipation develops in the form of heat, which has to be discharged particularly efficiently in order to ensure continuous operation of the gradient coil unit.

Gradient coil units are known in particular for examinations of the head, which, if required, can be positioned inside the patient-receiving area. Examples of this are disclosed in U.S. Ser. No. 10/908,241 and U.S. Ser. No. 11/422,215.

BRIEF DESCRIPTION OF THE DRAWINGS/FIGURES

The accompanying drawings, which are incorporated herein and form a part of the specification, illustrate the embodiments of the present disclosure and, together with the description, further serve to explain the principles of the embodiments and to enable a person skilled in the pertinent art to make and use the embodiments.

FIG. 1 shows a primary conductor structural unit of a gradient coil unit according to an exemplary embodiment.

FIG. 2 shows a cross-section of an arrangement of the cooling duct and of a primary electrical conductor in cross-section according to an exemplary embodiment.

FIG. 3 shows a cross-section of an arrangement of the cooling duct and of a primary electrical conductor according to an exemplary embodiment.

FIG. 4 shows a cross-section of an arrangement of the cooling duct and of a primary electrical conductor according to an exemplary embodiment.

Figure 6:
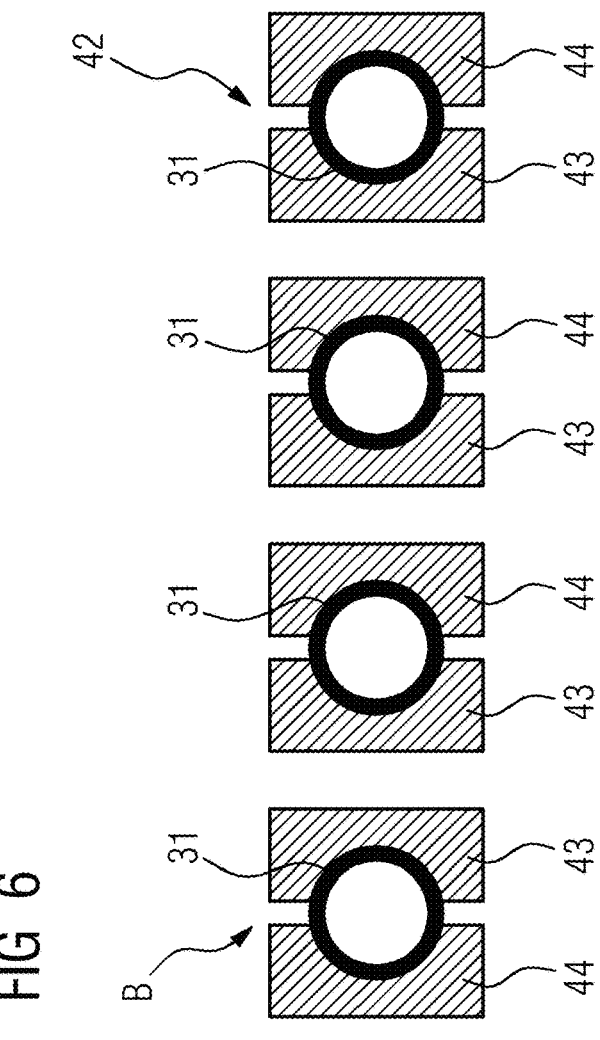
FIG. 6 shows a cross-section of an arrangement of the cooling duct and of a primary electrical conductor with a plurality of windings of the primary conductor structural unit according to an exemplary embodiment.

The exemplary embodiments of the present disclosure will be described with reference to the accompanying drawings. Elements, features and components that are identical, functionally identical and have the same effect are—insofar as is not stated otherwise—respectively provided with the same reference character.

DETAILED DESCRIPTION

In the following description, numerous specific details are set forth in order to provide a thorough understanding of the embodiments of the present disclosure. However, it will be apparent to those skilled in the art that the embodiments, including structures, systems, and methods, may be practiced without these specific details. The description and representation herein are the common means used by those experienced or skilled in the art to most effectively convey the substance of their work to others skilled in the art. In other instances, well-known methods, procedures, components, and circuitry have not been described in detail to avoid unnecessarily obscuring embodiments of the disclosure. The connections shown in the figures between functional units or other elements can also be implemented as indirect connections, wherein a connection can be wireless or wired. Functional units can be implemented as hardware, software or a combination of hardware and software.

An object of disclosure is to provide a gradient coil unit for generating a particularly high magnetic field gradient with strong rise and drop rates.

The inventive gradient coil unit may comprise a gradient coil surrounding a cylinder axis and embodied to generate a magnetic field gradient in a first spatial direction, which gradient coil comprises a hollow cylindrical primary layer comprising two primary conductor structural units and a cooling duct, wherein one primary conductor structural unit respectively of the two primary conductor structural units is formed from one primary electrical conductor respectively, which primary electrical conductor can be divided into two sections connected to one another in series and is arranged in such a way that the cooling duct is arranged at least partially between the two sections, the two sections and the cooling duct run at least partially parallel, and the two sections have one contact surface respectively with the cooling duct.

The first spatial direction may be perpendicular to the longitudinal direction and corresponds to the x-direction or the y-direction. The gradient coil unit is typically embodied to surround the cylinder axis hollow cylindrically in the longitudinal direction. The cylinder axis typically corresponds to the longitudinal direction and/or is parallel to it. The primary layer can correspond to the primary coil of the gradient coil. The primary coil of the gradient coil can comprise further layers, in particular further primary layers. The primary layer typically describes a circumferential surface of a cylinder. A primary conductor structural unit is typically arranged on the circumferential surface described by the primary layer and/or is saddle-shaped. The two primary conductor structural units may be arranged on the same circumferential surface of a cylinder and/or are saddle-shaped with identical curvature and/or have the same radial distance from the cylinder axis. The two primary conductor structural units may differ by way of their position in the circumferential direction of the cylinder, which can differ, for example, by 180°, or in the longitudinal direction, with a primary conductor structural unit completely surrounding half of the cylinder in the circumferential direction in the longitudinal direction.

The primary layer typically comprises two primary electrical conductors. Each primary electrical conductor of the two primary electrical conductors is typically formed to produce one primary conductor structural unit respectively of the two primary conductor structural units of the primary layer. A primary conductor structural unit typically comprises a primary electrical conductor in a defined geometric arrangement. The primary electrical conductor and/or the primary conductor structural unit is typically at least partially helical, having windings with different radii relative to at least one fixed point.

Each primary electrical conductor of the two primary electrical conductors can typically be divided into two sections electrically connected to one another in series. The primary electrical conductor is typically arranged spirally in windings in such a way that two adjacent windings of the electrical conductor are to be associated with the two mutually different sections. The primary electrical conductor can be divided into two sections connected to one another in series and/or can be composed of the two sections. The two sections may continuously merge into one another at exactly one position, are accordingly connected, in particular at this position. The length of the two sections may differs by less than 5%. The two sections can accordingly be referred to as the halves of the primary electrical conductor.

Each primary electrical conductor of the two primary electrical conductors can also be divided into more than two, in particular into three, four, or into a plurality of sections electrically connected to one another in series, wherein the cooling duct is arranged at least partially between the more than two sections, the more than two sections and the cooling duct run at least partially parallel, and the more than two sections have one contact surface respectively with the cooling duct.

With an at least partially helical implementation of the primary electrical conductor and/or the primary conductor structural unit having windings with different radii relative to at least one fixed point, the primary electrical conductor may be arranged in such a way that a plurality of windings run on a connecting line between the fixed point and an external edge of the conductor structural unit, with the connecting line at least partially alternately crossing a winding associated with a first section of the two sections connected to one another in series and a winding associated with the second section of the two sections connected to one another in series. A winding is to be associated with the first section if the winding is formed from the first section of the electrical conductor. A winding is to be associated with the second section if the winding is formed from the second section of the electrical conductor.

The primary layer may comprises at least one cooling duct. In an exemplary embodiment, the primary layer includes at least two cooling ducts. A cooling duct is typically embodied in the shape of a hollow cylinder and embodied to receive a cooling medium, in particular a fluid. The cooling duct is typically embodied in such a way that a fluid can be surrounded by it, or a cooling medium, in particular a fluid, can flow inside the cooling duct or, in particular, along the length of the cooling duct. It is possible for a cooling medium to flow through the cooling duct.

The first section, the second section and the cooling duct are arranged at least partially parallel. The largely mutually parallel arrangement can be referred to as a unit. The unit is typically at least partially helically arranged in windings surrounding the fixed point. Typically, the cooling duct is arranged between the first section and the second section of a unit, with the shape of the primary electrical conductor, in particular of the first section and the second section, and the shape of the cooling duct being coordinated with one another in such a way that the first section has one contact surface with the cooling duct and the second section has one contact surface with the cooling duct respectively. The contact surfaces may be at least partially parallel to the parallel arrangement and/or along the parallel arrangement of the two sections and the cooling duct. The two sections may run parallel to the longitudinal axis of the cooling duct. In particular, the cooling duct can be at least partially surrounded in its circumferential direction along at least 70%, preferably along at least 80%, particularly preferably along at least 90%, of its length by the first section and second section.

With an at least partially helical implementation of the primary electrical conductor and/or the primary conductor structural unit and of the cooling duct and/or the unit having windings with different radii relative to at least one fixed point, the unit may be arranged in such a way that on a connecting line between the fixed point and an external edge of the conductor structural unit, the unit runs in a plurality of windings, with the connecting line crossing the unit multiple times in the order: first section, cooling duct, second section.

The inventive gradient coil unit accordingly enables a hollow conductor to be formed from two sections of the same primary electrical conductor, which are electrically connected to one another in series, and a cooling duct positioned in between. This arrangement of the cooling duct enables particularly efficient cooling and the inventive geometric arrangement and electrical wiring of the primary electrical conductor enables a particularly high current density in the primary layer: in particular, maximum gradient amplitudes of up to 500 mT/m/s can be attained hereby.

One embodiment of the gradient coil unit provides that the primary electrical conductor is arranged in such a way that when the gradient coil is actuated, a parallel, in particular rectified, flow of current is generated in the two sections. The primary electrical conductor, in particular the two sections, may be arranged in such a way that when the primary coil and/or the primary layer is actuated, in particular when the primary conductor structural unit is actuated, an electrical current is identically oriented and/or oriented in parallel in the two sections. The flow of current on the two sides of the cooling duct in the first section and second section is accordingly rectified. This embodiment enables a particularly high current density, so a particularly high maximum amplitude of the magnetic field gradient can be attained in the first spatial direction.

One embodiment of the gradient coil unit provides that the cooling duct comprises electrically conductive material and, on the side facing the primary electrical conductor and/or the two sections, the cooling duct has an insulating coating.

The primary electrical conductor may comprises electrically conductive material, in particular a metal (e.g., copper and/or aluminum) and/or is formed from, for example, copper and/or aluminum. Accordingly, the two sections may comprise electrically conductive material, in particular a metal, such as copper and/or aluminum. The cooling duct may comprises a metal, in particular steel, and/or is made from metal and/or steel.

The cooling duct is typically embodied in the shape of a hollow cylinder. According to this embodiment, the cooling duct has, for example, an insulating coating on the side remote from the cooling medium, in particular on the external circumferential surface. The cooling duct can also have an insulating coating on the side facing the cooling medium, in particular on the internal circumferential surface. An insulating coating is typically a high-resistance layer, in particular a paint, which has greater electrical resistance than the cooling duct and/or the primary electrical conductor.

In particular with an arrangement of the primary electrical conductor such that a parallel, in particular rectified, flow of current is generated in the two sections on actuation of the gradient coil, a mutually different voltage is applied in the first section and in the second section on the two sides of the cooling duct. On actuation of a single primary conductor structural unit, for example a voltage of 550V can drop, so when the primary electrical conductor is divided into two sections, a voltage of approximately 275V drops per section. This can result in a voltage difference of 275V between the first section and the second section on the two sides of the cooling duct, in particular at an identical longitudinal position relative to the cooling duct. The insulating coating prevents a flow of current from the first section to the second section via the cooling duct and/or a flow of current along the cooling duct or a cooling medium encompassed by the cooling duct, in particular a bypassing and/or short-circuiting of the cooling duct, in particular at a longitudinal position, which does not correspond to the position at which position the two sections continuously merge into one another in series. As a result, it is possible to ensure generation of the magnetic field gradient in the first spatial direction. The primary electrical conductor typically has an insulating coating and/or is cast with casting material, in particular epoxy resin. An insulating coating of this kind of the primary electrical conductor can have insulation voids, however, whereby the electrical resistance between the two sections can be reduced and when there is no insulation of the cooling duct in the longitudinal direction, more widely spaced apart insulation voids on the insulating coating of the primary electrical conductor, a current can flow from the first section to the second section.

This embodiment enables a primary conductor structural unit with an inventive arrangement to be robustly operated even in the case of large differences in voltage between the first section and the second section, in particular with a high drop in voltage over the entire primary conductor structural unit therefore.

One embodiment of the gradient coil unit provides that the two sections are separated from one another perpendicular to a longitudinal axis of the cooling duct by the cooling duct and/or by an insulating layer. The insulating layer can comprise, for example, a casting compound of the gradient coil unit, in particular epoxy resin. The insulating layer can also comprise a paint and/or a foil. The insulating layer can also be embodied as an insulating coating of the surface of the primary electrical conductor.

In an exemplary embodiment, the primary electrical conductor and/or the two sections has/have an insulating coating. This embodiment enables a defined flow of current in the primary electrical conductor and prevents, in particular, a flow of current via the cooling duct and/or a bridging of the two sections by the cooling duct. In particular in combination with an insulating coating of the cooling duct, it is possible to ensure that even in the case of insulation voids in an insulating coating and/or great differences in voltage between the first section and the second section, it is possible to guarantee robust operation of the primary layer.

One embodiment of the gradient coil unit provides that the two sections at least partially surround the cooling duct and/or are at least partially flush with the cooling duct. In particular, the shape of the primary electrical conductor and/or the two sections can be adapted to a cross-section of the cooling duct. This embodiment enlarges the contact surface between the primary electrical conductor and the cooling duct, whereby cooling can be particularly efficient.

One embodiment of the gradient coil unit provides that the cooling duct is embodied in the shape of a hollow cylinder and/or the primary electrical conductor has a cross-section in the shape of a rectangle with a recess in the shape of a segment of a circle. In particular, the two sections can have a cross-section in the shape of a rectangle with a recess in the shape of a segment of a circle. According to this embodiment, the unit comprising the first section, the second section and the cooling duct has a rectangular cross-section, with the cooling duct having a round cross-section. Rectangular cross-sections are advantageous, in particular when manufacturing a gradient coil unit, since a primary conductor structural unit of this kind can be embodied particularly robustly as a saddle-shape and simultaneously enables a high current density. A round cross-section of the cooling duct simultaneously enables particularly efficient cooling of the primary electrical conductor.

One embodiment of the gradient coil unit provides that the two primary conductor structural units are axially symmetrical to one another, in particular are embodied with the cylinder axis as the axis of symmetry.

The gradient coil unit and/or the primary layer can typically be divided into two halves and/or the gradient coil unit comprises two halves, with these two halves typically only defining two disjunct geometric regions of the gradient coil unit. The two halves typically designate regions of the gradient coil unit, with a transition between the two halves respectively being free from a physical and/or visible separation. The halves of the gradient coil unit are typically separated from one another by a plane parallel to the longitudinal direction, in particular by a plane comprising the cylinder axis, or by a plane perpendicular to the longitudinal direction. The primary layer comprises two primary conductor structural units, which typically extend spatially over one half of the primary layer respectively. The two primary conductor structural units are typically saddle-shaped respectively and/or mutually symmetrical to the cylinder axis. This embodiment enables generation of a particularly homogenous magnetic field gradient.

One embodiment of the gradient coil unit provides that the two primary conductor structural units respectively are embodied asymmetrically with regard to a plane perpendicular to the cylinder axis. Each of the two primary conductor structural units may be embodied asymmetrically with regard to each plane perpendicular to the cylinder axis. According to this embodiment, the gradient coil unit may be embodied as a local gradient coil unit, in particular as a head gradient coil unit. A local gradient coil unit typically requires a smaller diameter and is embodied to receive the head of the examination object, in particular is embodied to not receive the abdomen. This enables the primary layer to be positioned close to the examination region and especially enables rise and drop rates of several 100 kA/s. A head gradient coil unit is typically particularly suitable if the examination region comprises only the head of the examination object, and this can be achieved particularly effectively using an asymmetrical local gradient coil unit. A local gradient coil unit, in particular a head gradient coil unit, is typically less limited with regard to SAR and peripheral nerve stimulation than a main gradient coil unit. Similarly, the homogeneity of the magnetic field gradient and/or the main magnetic field inside the examination region is improved. An asymmetrical primary conductor structural unit enables good adjustment of the gradient coil unit to the anatomy of the examination object.

One embodiment of the gradient coil unit provides that the primary layer comprises two cooling ducts and the gradient coil two cooling circuits, wherein one cooling duct respectively is associated with a primary conductor structural unit of the two primary conductor structural units and with one cooling circuit of the two cooling circuits. The gradient coil can also comprise the two cooling circuits. A cooling circuit typically comprises a cooling duct surrounding a cooling medium and a cooling unit embodied to lower the temperature of the cooling medium and/or to generate a flow of the cooling mediums in the cooling duct. The two cooling circuits can also comprise a shared cooling unit and/or be fed from the same cooling medium reservoir. This embodiment provides cooling of the primary layer by means of a pair of cooling circuits. In particular, each of the two primary conductor structural units can be cooled separately by means of a separate cooling circuit. This enables particularly efficient and well-regulated dissipation of the heat that develops during operation of the gradient coil, and therewith efficient cooling.

One embodiment of the gradient coil unit provides that the gradient coil comprises a further primary layer, which is embodied in the shape of a hollow cylinder and radially surrounds the primary layer, in particular has a larger radius than the primary layer therefore. The further primary layer comprises two further primary conductor structural units and a cooling duct, wherein one further primary conductor structural unit respectively of the two further primary conductor structural units is formed from one further primary electrical conductor respectively, and the primary layer and the further primary layer are jointly embodied to generate a magnetic field gradient in the first spatial direction. The further primary layer may comprise two cooling ducts, wherein one cooling duct respectively of the two cooling ducts encompassed by the further primary layer is associated respectively with a further primary conductor structural unit of the two further primary conductor structural units. The primary layer and the further primary layer may jointly comprise five cooling ducts, in particular five cooling circuits. According to this embodiment, the primary coil accordingly comprises at least two layers comprising the primary layer and the further primary layer. A two-layer gradient coil is described, for example, in DE102018206643A1. Each of the two further primary electrical conductors may be divided into two sections connected to one another in series and is arranged in such a way that the cooling duct is arranged at least partially between the two sections, the two sections and the cooling duct run at least partially parallel, and the two sections have one contact surface respectively with the cooling duct.

This embodiment enables efficient generation of particularly strong magnetic field gradients, in particular for a local gradient coil unit.

One embodiment of the gradient coil unit provides that the gradient coil comprises a secondary layer, which is embodied in the shape of a hollow cylinder and radially surrounds the further primary layer, in particular has a larger radius than the further primary layer and/or the primary layer therefore. The secondary layer comprises two secondary conductor structural units and a cooling duct, wherein one secondary conductor structural unit respectively of the two secondary conductor structural units is formed from one secondary electrical conductor respectively, and the secondary layer is embodied to compensate a stray magnetic field developing in the first spatial direction during the generation of the magnetic field gradient. Each of the two secondary electrical conductors may be divided into two sections connected to one another in series and is arranged in such a way that the cooling duct is arranged at least partially between the two sections, the two sections and the cooling duct run at least partially parallel, and the two sections have one contact surface respectively with the cooling duct. This embodiment enables efficient shielding of the gradient coil unit.

One embodiment of the gradient coil unit provides that the gradient coil comprises a middle layer, which may be embodied in the shape of a hollow cylinder and radially surrounds the primary layer. The middle layer may have a larger radius than the primary layer and/or the further primary layer therefore, and a smaller radius than the secondary layer. The middle layer comprises two middle conductor structural units and a cooling duct, wherein one middle conductor structural unit respectively of the two middle conductor structural units is formed from one middle electrical conductor respectively, and the middle layer is embodied to compensate eddy currents. Each of the two middle electrical conductors may be divided into two sections connected to one another in series and arranged in such a way that the cooling duct is arranged at least partially between the two sections, the two sections and the cooling duct run at least partially parallel, and the two sections have one contact surface respectively with the cooling duct.

The middle layer can be arranged between the primary layer and the further primary layer. The middle layer can be arranged between the further primary layer and the secondary layer. The middle layer is typically arranged between the primary layer and the secondary layer. The advantages of a middle layer, in particular for an asymmetrical gradient coil unit and/or local gradient coil unit, are disclosed in DE102018206643A1. This embodiment accordingly enables efficient generation of high magnetic field gradients with effective compensation of developing eddy currents at the same time.

One embodiment of the gradient coil unit provides that one primary electrical conductor respectively is electrically connected in series to one further primary electrical conductor respectively and one secondary electrical conductor respectively. In addition, if present, a middle electrical conductor of the two middle electrical conductor can also be electrically connected in series to one primary electrical conductor respectively. The electrical conductors connected to one another in series are typically actuated by means of a gradient amplifier unit. This enables consolidated actuation of the plurality of conductor structural units arranged in mutually different layers.

Furthermore, the disclosure starts from a gradient system comprising an inventive gradient coil unit and at least two gradient amplifier units, wherein one of the two gradient amplifier units respectively is connected in series with one primary electrical conductor respectively. A gradient amplifier unit connected to a primary conductor structural unit is embodied to generate a defined electrical voltage and/or a defined electrical current in the primary conductor structural unit, typically predefined by a gradient controller and/or an MR control sequence. The two gradient amplifier units connected to two primary conductor structural units, which are to be associated with a primary coil, in particular are encompassed by a primary coil, are typically actuated synchronously and/or simultaneously and/or with the same amplitude. The electrical currents and/or electrical voltages generated by these two gradient amplifier units typically differ by less than 1%, preferably by less than 0.5%, in particular at any instant of playing-out of an MR control sequence.

The gradient system may comprise six gradient amplifier units. The gradient coil unit may comprise three gradient coils and therewith three primary coils. Two of the three gradient coils differ solely by way of their position in the circumferential direction, which differ from one another by 90°. A third of the three gradient coils typically has two helical primary conductor structural units.

One primary conductor structural unit or helical primary conductor structural unit respectively can typically be actuated by one of the six gradient amplifier units respectively.

Due to the high number of gradient amplifier units and the special wiring, a gradient system of this kind is embodied to generate particularly high electrical voltages in the individual primary conductor structural units. This enables a particularly high amplitude of the magnetic field gradient, in particular in the first spatial direction, and at the same time, high rise and drop rates despite a high inductance of the primary coil and/or primary layer.

Furthermore, the disclosure starts from a magnetic resonance device comprising a main magnet, a radio-frequency antenna unit, an inventive gradient system and a gradient controller, connected to the gradient system, embodied to actuate the gradient system to generate a magnetic field gradient in the first spatial direction. The gradient controller is embodied, in particular, to forward items of information according to an MR control sequence, in particular gradient pulses, to the gradient amplifier units encompassed by the gradient system.

Embodiments of the inventive magnetic resonance device and of the inventive gradient system are designed analogously to the embodiments of the inventive gradient coil unit. The advantages of the inventive magnetic resonance device and of the inventive gradient system substantially match the advantages of the inventive gradient coil unit, which have been stated above in detail. Features, advantages or alternative embodiments mentioned in this connection can likewise also be transferred to the other embodiments, and vice versa.

FIG. 1 shows an exemplary embodiment of a primary conductor structural unit 41 of an inventive gradient coil unit 19 in a schematic representation.

The primary conductor structural unit 41 is part of the hollow cylindrical primary layer 40, which surrounds a cylinder axis in the longitudinal direction z in a hollow cylindrical manner, and is represented in unwound form in the circumferential direction do. The primary conductor structural unit 41 typically spans 180° in the circumferential direction do, i.e. half of the gradient coil unit 19 in the circumferential direction, and is thus typically saddle-shaped. A second primary conductor structural unit 41' encompassed by the primary layer 40 and the primary conductor structural unit 41 may be axially symmetrical to one another with the cylinder axis as the axis of symmetry. The primary conductor structural unit 41 is formed from a primary electrical conductor 42. The primary conductor structural unit 41 and/or the primary electrical conductor 42 is at least partially helically arranged, in particular in windings surrounding at least one center point. The primary layer 40 comprises a cooling duct 31 (not represented), moreover. The primary conductor structural unit 41 may be embodied to be asymmetrical with regard to a plane perpendicular to the cylinder axis z. The primary conductor structural unit 41 may be embodied to be asymmetrical with regard to each plane perpendicular to the cylinder axis z.

FIG. 2 shows an exemplary embodiment of an arrangement of the cooling duct 31 and a primary electrical conductor 42 in cross-section in a schematic representation. The cross-section can correspond, for example, to the detail A in FIG. 1. The primary electrical conductor 42 can be divided into two sections 43, 44 connected to one another in series. These sections 43, 44 are arranged in such a way that the two sections 43, 44 and the cooling duct run at least partially parallel and the cooling duct 31 is arranged at least partially between the two sections 43, 44. Consequently, the two sections 43, 44 typically at least partially surround the cooling duct 31. The two sections 43, 44 have one contact surface respectively with the cooling duct 31, in particular along the longitudinal direction thereof. The two sections 43, 44 may be at least partially flush with the cooling duct 31. In particular, the cross-sectional area of the two sections 43, 44 may be embodied in such a way that the two sections 43, 44 have a shape adapted to a cross-section of the cooling duct 31. In an exemplary embodiment, the cooling duct 31 is embodied in the shape of a hollow cylinder and the primary electrical conductor 42 has a cross-section in the shape of a rectangle with a recess in the shape of a segment of a circle. The radius of the segment of a circle corresponds to the external radius of the cooling duct 31.

FIG. 3 shows an exemplary embodiment of an arrangement of the cooling duct and a primary electrical conductor in cross-section in a schematic representation. Accordingly, the cooling duct 31 comprises electrically conductive material and, on the side facing the primary electrical conductor 42 and/or the two sections 43, 44, the cooling duct 31 has an insulating coating 32.

FIG. 4 shows an exemplary embodiment of an arrangement of the cooling duct and a primary electrical conductor in cross-section in a schematic representation. Here, perpendicular to a longitudinal axis of the cooling duct 31, the two sections 43, 44 are separated from one another by the cooling duct 31 and/or by an insulating layer 33. In particular, the cooling duct 31 is arranged between the two sections 43, 44 running largely parallel. At positions at which the spatial extension of the two sections 43, 44 is greater than the spatial extension of the cooling duct 31, according to the third embodiment, an insulating layer 33, for example in the form of a coat of paint, is arranged between the two sections 43, 44. The insulating coating 32 and the insulating layer 33 can comprise the same material.

Figure 5:
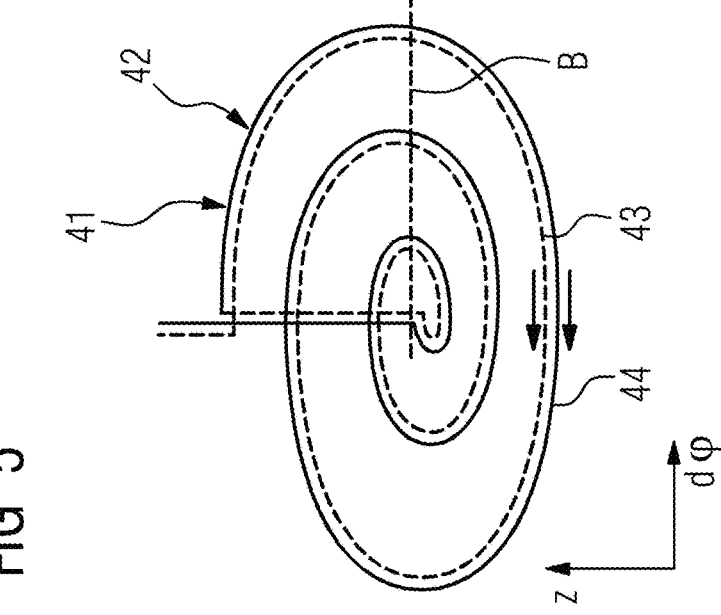
FIG. 5 shows a primary conductor structural unit of a gradient coil unit according to an exemplary embodiment.

FIG. 5 shows an exemplary embodiment of a primary conductor structural unit 41 of an inventive gradient coil unit 19 in a simplified schematic representation. In particular, the helical arrangement of the primary electrical conductor 42 is represented in a simplified manner with a reduced number of windings and/or a simplified form of the windings. In addition, a representation of the cooling duct 31 has been omitted for easier identification of the course of the primary electrical conductor 42, in particular of the two sections 43, 44. FIG. 5 shows one possible course of the primary electrical conductor 42 and its division into sections 43, 44 of the primary electrical conductor 42 which are parallel but connected to one another in series. The arrows drawn on the sections 43, 44 indicate a direction of a flow of current for generating a magnetic field gradient in the first spatial direction. It can be seen here that a parallel, in particular rectified, flow of current is generated in the two adjacent sections 43, 44. The broken line marked B in FIG. 5 is not a structure encompassed by the conductor structural unit 41. Instead it merely visualizes the position of the cross-section represented in FIG. 6.

FIG. 6 shows an exemplary embodiment of an arrangement of the cooling duct and a primary electrical conductor with a plurality of windings of the primary conductor structural unit in cross-section along the line B drawn in FIG. 5, in a schematic representation. The two sections 43, 44 and the cooling duct 31 intersect the line B multiple times at various positions in the circumferential direction. The arrangement of the cooling duct 31 and a primary electrical conductor 42 is embodied in such a way that the spacing between two adjacent units, comprising the two sections 43, 44 and the cooling duct 31 respectively, is greater than the diameter of the cooling duct 31 and/or is greater than the diameter of a unit. In particular, adjacent units are free from a contact surface. Adjacent units are typically characterized in that the gaps between the windings of the adjacent units are free from an electrical conductor.

Figure 7:
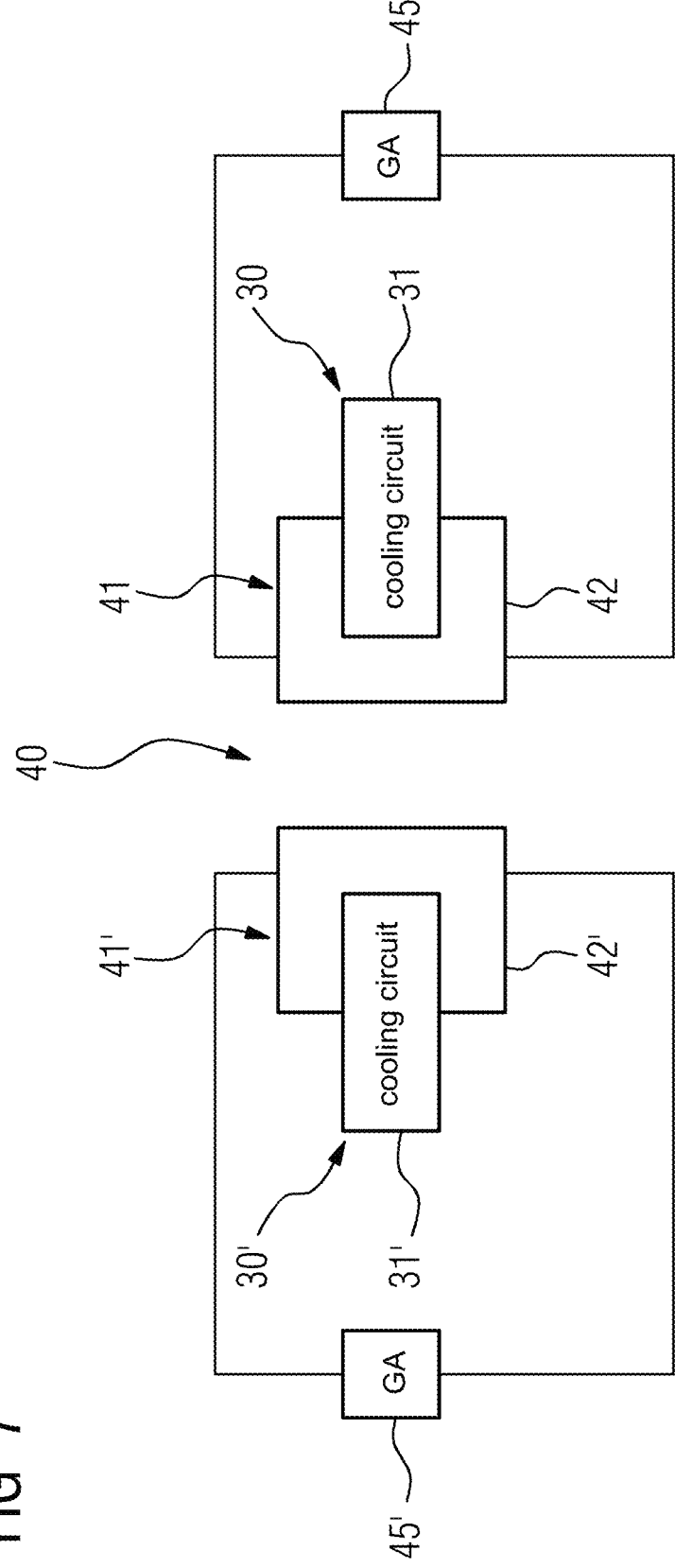
FIG. 7 shows a gradient system according to an exemplary embodiment.

FIG. 7 shows an exemplary embodiment of an inventive gradient system in a schematic representation. The gradient system may comprises an inventive gradient coil unit 19 with a hollow cylindrical primary layer 40 comprising two primary conductor structural units 41, 41' formed from one primary electrical conductor 42, 42' respectively. The gradient system, in particular the primary layer 40, according to the first embodiment represented in FIG. 7 comprises two cooling ducts 31, 31', moreover, with one cooling duct of the two cooling ducts 31, 31' respectively being associated with a primary conductor structural unit of the two primary conductor structural units 41, 41'. Furthermore, the gradient system accordingly may include two gradient amplifier units 45, 45', with one of the two gradient amplifier units respectively being connected in series to one primary electrical conductor 42, 42' respectively. The gradient coil comprises two cooling circuits 30, 30', with one cooling duct respectively of the two cooling ducts 31, 31' being associated with a cooling circuit of the two cooling circuits 30, 30'.

Figure 8:
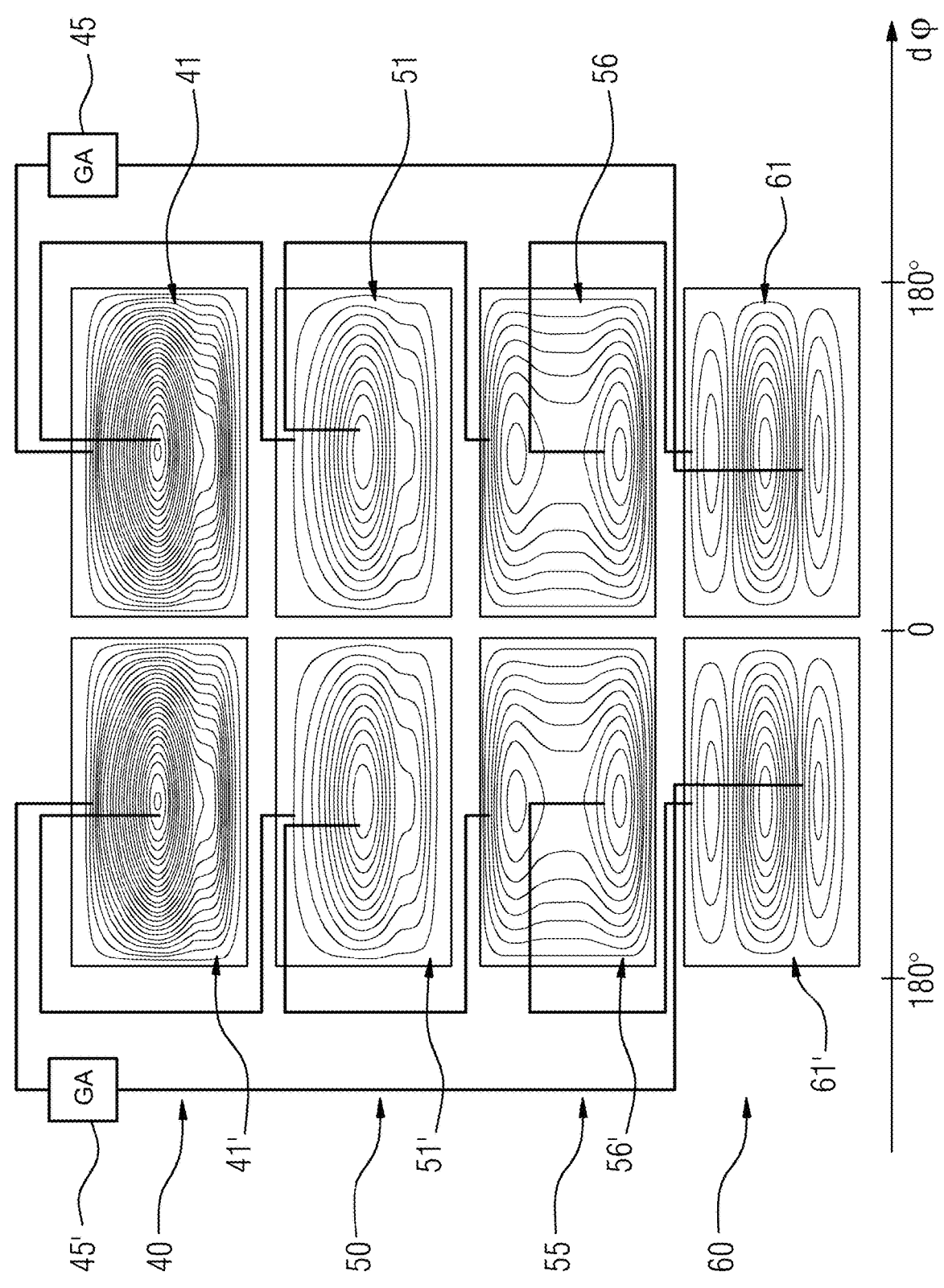
FIG. 8 shows a gradient system according to an exemplary embodiment.

FIG. 8 shows an exemplary embodiment of an inventive gradient system in a schematic representation. Here, the gradient system differs by way of the gradient coil, which comprises further layers apart from the primary layer 40. In particular, the gradient coil comprises a further primary layer 50, which is embodied in the shape of a hollow cylinder and radially surrounds the primary layer 40. The further primary layer 50 comprises two further primary conductor structural units 51, 51' and a cooling duct (not represented), with one further primary conductor structural unit respectively of the two further primary conductor structural units 51, 51' being formed from one further primary electrical conductor respectively, and the primary layer 40 and the further primary layer 50 are jointly embodied to generate a magnetic field gradient in the first spatial direction.

In addition, the gradient coil comprises a middle layer 55, which is embodied in the shape of a hollow cylinder and radially surrounds the further primary layer 50. The middle layer 55 comprises two middle conductor structural units 56, 56' and a cooling duct (not represented), with one middle conductor structural unit respectively of the two middle conductor structural units 56, 56' being formed from one middle electrical conductor respectively.

In addition, the gradient coil comprises a secondary layer 60, which is embodied in the shape of a hollow cylinder and radially surrounds the further primary layer 50 and also the middle layer 55. The secondary layer 60 comprises two secondary conductor structural units 61, 61' and a cooling duct (not represented), with one secondary conductor structural unit respectively of the two secondary conductor structural units 61, 61' being formed from a secondary electrical conductor. The secondary layer 60 is embodied to shield the magnetic field gradient in the outer region of the gradient coil unit 19.

One of the two gradient amplifier units 45, 45' respectively is connected in series to one primary electrical conductor 42, 42' respectively, one further primary electrical conductor respectively, one secondary electrical conductor respectively and one middle electrical conductor respectively.

Figure 9:
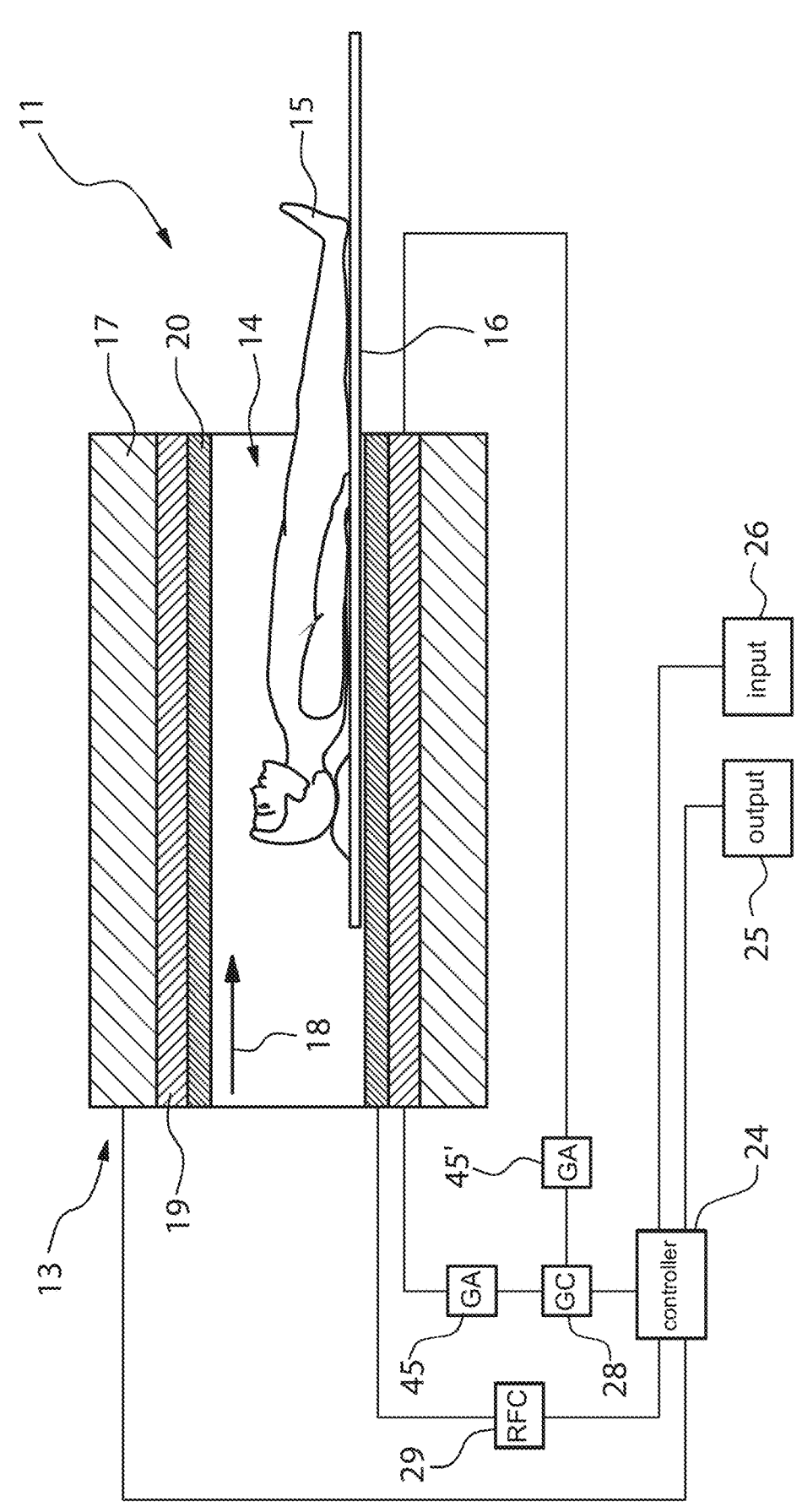
FIG. 9 shows a magnetic resonance device according to an exemplary embodiment.

FIG. 9 shows a magnetic resonance (MR) device 11 according to an exemplary embodiment. The magnetic resonance device 11 may comprise a detector unit (detector) 13 with a main magnet 17 for generating a strong and, in particular, constant main magnetic field 18 parallel to the longitudinal direction, in particular parallel to the cylinder axis. In addition, the magnetic resonance device 11 has a cylindrical patient-receiving area 14 for receiving a patient 15, with the patient-receiving area 14 being cylindrically surrounded by the detector unit 13 in a circumferential direction. The patient 15 can be pushed into the patient-receiving area 14 by means of a patient-positioning apparatus 16 of the magnetic resonance device 11. For this purpose, the patient-positioning apparatus 16 has a patient table, which is movably arranged inside the magnetic resonance device 11. The detector unit 13 also has a radio-frequency antenna unit 20 which, in the case shown, is embodied as a body coil permanently integrated in the magnetic resonance device 11, and a radio-frequency antenna controller 29 for exciting a polarization, which is established in the main magnetic field 18 generated by the main magnet 17. The radio-frequency antenna unit 20 is actuated by the radio-frequency antenna controller 29 and radiates high-frequency radio-frequency pulses into an examination space, which is substantially formed by the patient-receiving area 14. The detector unit 13 may also be referred to as scanner 13.

Furthermore, the detector unit 13 may include an inventive gradient coil unit 19, which is used for spatial encoding during imaging. The gradient coil unit 19 comprises a hollow cylindrical primary layer 40 as part of a gradient coil surrounding the cylindrical patient-receiving area 14 in the longitudinal direction, which gradient coil is embodied to generate a magnetic field gradient in a first spatial direction. The primary layer 40 comprises two primary conductor structural units 41, 41', with one primary conductor structural unit respectively of the two primary conductor structural units being formed from one primary electrical conductor 42, 42' respectively. The magnetic resonance device 11 comprises two gradient amplifier units 45, 45', moreover, with one of the two gradient amplifier units 45, 45' respectively being connected in series to one primary electrical conductor 42, 42' respectively.

The gradient coil unit 19, in particular the two gradient amplifier units 45, 45', are actuated by means of a gradient controller 28 to generate a magnetic field gradient in the first spatial direction. The gradient controller 28 is typically embodied to actuate all gradient amplifier units 45, 45' encompassed by the gradient system. For this, the gradient controller 28 is typically connected to the gradient amplifier units 45, 45', and these are embodied to generate an electrical voltage and/or an electrical current, in particular gradient pulses according to an MR control sequence in the gradient coil unit 19, as predefined, for example, by the gradient controller 28. Reference should be made, in particular, to FIGS. 1 to 8 for a detailed representation of the gradient coil unit 19 and/or the primary layer 40.

The MR device 11 may include a controller 24 configured to control the main magnet 17, the gradient controller 28, the radio-frequency antenna controller 29, and/or the magnetic resonance device 11 and/or component(s) therein. The controller 24 may centrally control the magnetic resonance device 11, such as the implementation of MR control sequences. In an exemplary embodiment, the controller 24 may include processing circuitry that is configured to perform one or more functions/operations of the controller 24.

The magnetic resonance device 11 may have an output unit (e.g., display, speaker, etc.) 25. In addition, the magnetic resonance device 11 may have an input unit (e.g., keyboard, etc.) 26, by means of which items of information and/or control parameters can be input by a user during a measuring procedure. The input unit 26 and the output unit 25 may collectively form an input/output interface. In an exemplary embodiment, the controller 24 can comprise the gradient controller 28, radio-frequency antenna controller 29, the output unit (e.g., display, speaker, etc.) 25, and/or the input unit (e.g., keyboard, etc.) 26. In an exemplary embodiment, the MR device 11 and/or one or more components therein may include processing circuitry that is configured to perform one or more functions/operations of the MR device 11 and/or component(s) therein.

The represented magnetic resonance device 11 can of course comprise further components, which magnetic resonance devices 11 conventionally have. A general mode of operation of a magnetic resonance device 11 is known to a person skilled in the art, moreover, so a detailed description of the further components is omitted.

Although the disclosure has been illustrated and described in detail by the exemplary embodiments, it is not limited by the disclosed examples and a person skilled in the art can derive other variations herefrom without departing from the scope of the disclosure.

To enable those skilled in the art to better understand the solution of the present disclosure, the technical solution in the embodiments of the present disclosure is described clearly and completely below in conjunction with the drawings in the embodiments of the present disclosure. Obviously, the embodiments described are only some, not all, of the embodiments of the present disclosure. All other embodiments obtained by those skilled in the art on the basis of the embodiments in the present disclosure without any creative effort should fall within the scope of protection of the present disclosure.

It should be noted that the terms "first", "second", etc. in the description, claims and abovementioned drawings of the present disclosure are used to distinguish between similar objects, but not necessarily used to describe a specific order or sequence. It should be understood that data used in this way can be interchanged as appropriate so that the embodiments of the present disclosure described here can be implemented in an order other than those shown or described here. In addition, the terms "comprise" and "have" and any variants thereof are intended to cover non-exclusive inclusion. For example, a process, method, system, product or equipment comprising a series of steps or modules or units is not necessarily limited to those steps or modules or units which are clearly listed, but may comprise other steps or modules or units which are not clearly listed or are intrinsic to such processes, methods, products or equipment.

References in the specification to "one embodiment," "an embodiment," "an exemplary embodiment," etc., indicate that the embodiment described may include a particular feature, structure, or characteristic, but every embodiment may not necessarily include the particular feature, structure, or characteristic. Moreover, such phrases are not necessarily referring to the same embodiment. Further, when a particular feature, structure, or characteristic is described in connection with an embodiment, it is submitted that it is within the knowledge of one skilled in the art to affect such feature, structure, or characteristic in connection with other embodiments whether or not explicitly described.

The exemplary embodiments described herein are provided for illustrative purposes, and are not limiting. Other exemplary embodiments are possible, and modifications may be made to the exemplary embodiments. Therefore, the specification is not meant to limit the disclosure. Rather, the scope of the disclosure is defined only in accordance with the following claims and their equivalents.

Embodiments may be implemented in hardware (e.g., circuits), firmware, software, or any combination thereof. Embodiments may also be implemented as instructions stored on a machine-readable medium, which may be read and executed by one or more processors. A machine-readable medium may include any mechanism for storing or transmitting information in a form readable by a machine (e.g., a computer). For example, a machine-readable medium may include read only memory (ROM); random access memory (RAM); magnetic disk storage media; optical storage media; flash memory devices; electrical, optical, acoustical or other forms of propagated signals (e.g., carrier waves, infrared signals, digital signals, etc.), and others. Further, firmware, software, routines, instructions may be described herein as performing certain actions. However, it should be appreciated that such descriptions are merely for convenience and that such actions in fact results from computing devices, processors, controllers, or other devices executing the firmware, software, routines, instructions, etc. Further, any of the implementation variations may be carried out by a general-purpose computer.

The various components described herein may be referred to as "modules," "units," or "devices." Such components may be implemented via any suitable combination of hardware and/or software components as applicable and/or known to achieve their intended respective functionality. This may include mechanical and/or electrical components, processors, processing circuitry, or other suitable hardware components, in addition to or instead of those discussed herein. Such components may be configured to operate independently, or configured to execute instructions or computer programs that are stored on a suitable computer-readable medium. Regardless of the particular implementation, such modules, units, or devices, as applicable and relevant, may alternatively be referred to herein as "circuitry," "controllers," "processors," or "processing circuitry," or alternatively as noted herein.

For the purposes of this discussion, the term "processing circuitry" shall be understood to be circuit(s) or processor(s), or a combination thereof. A circuit includes an analog circuit, a digital circuit, data processing circuit, other structural electronic hardware, or a combination thereof. A processor includes a microprocessor, a digital signal processor (DSP), central processor (CPU), application-specific instruction set processor (ASIP), graphics and/or image processor, multi-core processor, or other hardware processor. The processor may be "hard-coded" with instructions to perform corresponding function(s) according to aspects described herein. Alternatively, the processor may access an internal and/or external memory to retrieve instructions stored in the memory, which when executed by the processor, perform the corresponding function(s) associated with the processor, and/or one or more functions and/or operations related to the operation of a component having the processor included therein.

In one or more of the exemplary embodiments described herein, the memory is any well-known volatile and/or non-volatile memory, including, for example, read-only memory (ROM), random access memory (RAM), flash memory, a magnetic storage media, an optical disc, erasable programmable read only memory (EPROM), and programmable read only memory (PROM). The memory can be non-removable, removable, or a combination of both.

The invention claimed is:

1. A gradient coil unit comprising:
a gradient coil surrounding a cylinder axis and configured to generate a magnetic field gradient in a first spatial direction, the gradient coil including a hollow cylindrical primary layer including two primary conductor structural units and a cooling duct, wherein:
each of the two primary conductor structural units includes a primary electrical conductor dividable into two mutually different sections electrically connected to one another in series, wherein a length of the two sections differs by less than 5%; and
the two sections of each of the respective primary electrical conductors are spirally arranged in windings such that:
two adjacent windings of the respective primary electrical conductor are associated with the two mutually different sections,
the cooling duct is arranged at least partially between the respective two sections,
the respective two sections and the cooling duct run at least partially parallel, and
the respective two sections have a single respective contact surface with the cooling duct.

2. The gradient coil unit as claimed in claim 1, wherein the respective primary electrical conductor is arranged such that, in response to the gradient coil being actuated, a parallel flow of current is generated in the two sections.

3. The gradient coil unit as claimed in claim 1, wherein the cooling duct comprises:
electrically conductive material, and
an insulating coating on a side facing the respective primary electrical conductor and/or the respective two sections.

4. The gradient coil unit as claimed in claim 1, wherein the respective two sections are separated from one another perpendicular to a longitudinal axis of the cooling duct by the cooling duct and/or by an insulating layer.

5. The gradient coil unit as claimed in claim 1, wherein the respective two sections at least partially surround the cooling duct and/or are at least partially flush with the cooling duct.

6. The gradient coil unit as claimed in claim 1, wherein:
the cooling duct has a hollow cylinder shape, and/or
the respective primary electrical conductor has a rectangular cross-section with a recess in a shape of a segment of a circle.

7. The gradient coil unit as claimed in claim 1, wherein the two primary conductor structural units are axially symmetrical to one another, with the cylinder axis as an axis of symmetry.

8. The gradient coil unit as claimed in claim 1, wherein the two primary conductor structural units are asymmetrically with respect to a plane perpendicular to the cylinder axis.

9. The gradient coil unit as claimed in claim 1, wherein the primary layer further comprises a second cooling duct and the gradient coil further comprises two cooling circuits, each of the primary conductor structural units being respectively associated with one of the two cooling ducts and one of the two cooling circuits.

10. The gradient coil unit as claimed in claim 1, wherein:

the gradient coil further comprises a further primary layer in a shape of a hollow cylinder and radially surrounding the primary layer, the further primary layer including two further primary conductor structural units and a further cooling duct, each of the two further primary conductor structural units is formed from a further primary electrical conductor, and the primary layer and the further primary layer are jointly configured to generate a magnetic field gradient in the first spatial direction.

11. The gradient coil unit as claimed in claim 10, wherein:

the gradient coil comprises a secondary layer in a shape of a hollow cylinder and radially surrounding the further primary layer, the secondary layer including two secondary conductor structural units and a cooling duct, each of the two secondary conductor structural units is formed from a secondary electrical conductor, and the secondary layer is configured to compensate a stray magnetic field developing in the first spatial direction during the generation of the magnetic field gradient.

12. The gradient coil unit as claimed in claim 11, wherein the respective primary electrical conductor, further primary electrical conductor, and secondary electrical conductor are electrically connected to one another in series.

13. The gradient coil unit as claimed in claim 10, wherein:

the gradient coil comprises a middle layer in a shape of a hollow cylinder and radially surrounding the further primary layer, the middle layer including two middle conductor structural units and a cooling duct, each of the two middle conductor structural units is formed from one middle electrical conductor, and the middle layer is configured to compensate eddy currents.

14. A gradient system comprising:

a gradient coil unit as claimed in claim 1; and at least two gradient amplifier units, wherein each of the two gradient amplifier units are respectively connected in series to the respective primary electrical conductors.

15. A magnetic resonance device comprising:

a main magnet;

a radio-frequency antenna unit;

a gradient system including:

a gradient coil unit as claimed in claim 1, and at least two gradient amplifier units, wherein each of the two gradient amplifier units are respectively connected in series to the respective primary electrical conductors; and a gradient controller connected to the gradient system and configured to actuate the gradient system to generate a magnetic field gradient in a first spatial direction.

* * * * *